United States Patent [19]

Itoh et al.

[11] Patent Number: 4,599,635
[45] Date of Patent: Jul. 8, 1986

[54] SEMICONDUCTOR INTEGRATED CIRCUIT DEVICE AND METHOD OF PRODUCING SAME

[75] Inventors: Kazuo Itoh, Kodaira; Katsumi Ogiue, Tokyo; Akio Hayasaka, Yamato, all of Japan

[73] Assignee: Hitachi, Ltd., Tokyo, Japan

[21] Appl. No.: 852,978

[22] Filed: Nov. 18, 1977

Related U.S. Application Data

[63] Continuation of Ser. No. 608,734, Aug. 28, 1975, abandoned.

[51] Int. Cl.$^4$ .................. H01L 27/04; H03K 19/091
[52] U.S. Cl. ...................................... 357/44; 357/20; 357/46; 357/92
[58] Field of Search .............................. 357/44, 46, 92

[56] References Cited

U.S. PATENT DOCUMENTS 3,581,165 5/1971 Seelbach et al. ................. 357/48
3,913,123 10/1975 Masaki et al. ..................... 357/92
4,056,810 11/1977 Hart et al. ....................... 357/92

Primary Examiner—William D. Larkins
Attorney, Agent, or Firm—Antonelli, Terry & Wands

[57] ABSTRACT

An I$^2$L device is disclosed wherein the P type injector region of a PNP transistor is formed so as to be buried in an N$^-$ type epitaxial layer below the P type collector region of the PNP transistor, whereby the carrier injection efficiency of the transistor is improved and a high switching speed is obtained. The I$^2$L device further includes an inversed NPN transistor wherein the abovementioned P type collector region of the PNP transistor works as a base region of the NPN transistor, an N type collector region is formed in the P type base region, and the abovementioned P type injector region extends between the N$^-$ type epitaxial layer and an N$^+$ type substrate except below the N type collector region so that the effective emitter portion of the NPN transistor is limited to a specific area immediately below the N type collector region, thereby to reduce the power consumption.

15 Claims, 15 Drawing Figures

SEMICONDUCTOR INTEGRATED CIRCUIT DEVICE AND METHOD OF PRODUCING SAME

CROSS-REFERENCE TO RELATED APPLICATION

This application is a continuation of application Ser. No. 608,734, entitled "SEMICONDUCTOR INTEGRATED CIRCUIT DEVICE AND METHOD OF PRODUCING SAME", filed Aug. 28, 1975, now abandoned.

BACKGROUND OF THE INVENTION

This invention relates to a semiconductor integrated circuit and a method of manufacturing the same, and more particularly to a semiconductor integrated injection logic circuit device and a method of manufacturing the same.

The integrated injection logic circuit (hereinafter referred to as the I²L circuit) is of a simple structure totally different from the conventional bipolar logic circuit, and such I²L circuit conception is described in, for instance, Nikkei Electronics, May 6, 1974, pp. 85–90, and U.S. Pat. Nos. 3,736,477 and 3,816,758. The basic arrangement of the gate circuit thereof is shown in FIG. 3a and its structural diagram is shown in FIG. 3b. The most salient feature of this circuit is that there are used a complementary pair of transistors. An NPN transistor Q1 of the multicollector type is disposed vertically in the substrate to act as an inverter, while a lateral PNP transistor Q2 acts as a constant current source to feed current to the collector of the NPN transistor of the previous stage (not shown) connected to a base 52 of the NPN transistor Q1 or to an input terminal B. This lateral PNP transistor also functions as a collector load of the NPN transistor of the preceding stage. An emitter 51 of this lateral PNP transistor is generally called an injector because it feeds current.

Such a gate circuit, as shown in FIG. 3b, can be constituted only from transistors without using any resistance for both the power source and the load. That is, an n⁺substrate 1 forms the common emitter En of the gate transistor Q1 and island-like n⁺layers 61, 62, 63 are arranged spaced apart from each other close to the surface to form multicollectors C1–C3. Thus, this circuit is characterized in that the NPN transistors are constituted from inverted transistors where the substrate 1 is designed to act as an emitter.

SUMMARY OF THE INVENTION

It is an object of the invention to improve the I²L circuits while increasing the switching speed.

According to one embodiment of the present invention designed for accomplishing the above-mentioned object, there is provided a semiconductor integrated circuit device of a I²L structure characterized in that an buried layer is formed at a part in the emitter region position immediately beneath the base region of the NPN transistor acting as an inverter and not containing the area immediately beneath the collector region of the NPN transistor, and such buried layer is used as an injector of the PNP transistor.

According to another embodiment of the present invention, there is provided a semiconductor integrated circuit device of the type characterized in that the injector of the PNP transistor is constituted from a buried layer formed at a portion in the emitter region other than that immediately below the collector region of the NPN transistor acting as an inverter.

In still another embodiment of the present invention, there is provided a method of producing the above-mentioned type of semiconductor integrated circuit device characterized in that impurities of the same conductivity type as the collector are partially introduced into the buried injector region formed in the previous step and positioned immediately beneath the semiconductor zone where the collector region is to be formed, by employing ion-implantation technology and also using a mask for forming the collector region of the NPN transistor acting as an inverter by diffusion, and thereafter or therebefore, the collector region of NPN transistor is formed by diffusion using the mask.

Now the present invention will be apparent from the following description of preferred embodiments thereof as illustrated in the accompanying drawings.

DESCRIPTION OF THE PREFERRED EMBODIMENTS

Figure 1A:
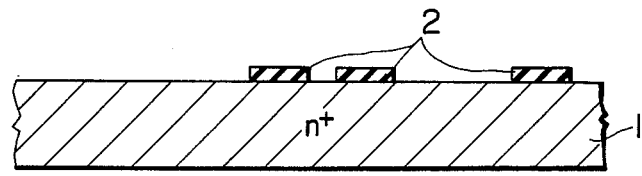
FIG. 1a to FIG. 1k are sectional views of a semiconductor integrated circuit in each step of the manufacturing process according to one embodiment of the present invention.
Figure 1B:
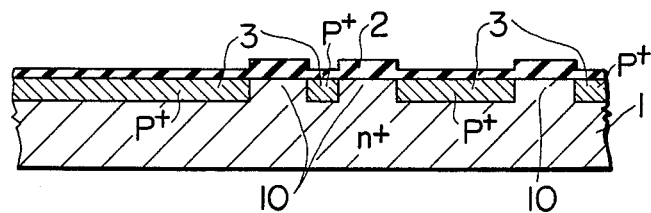
Figure 1C:
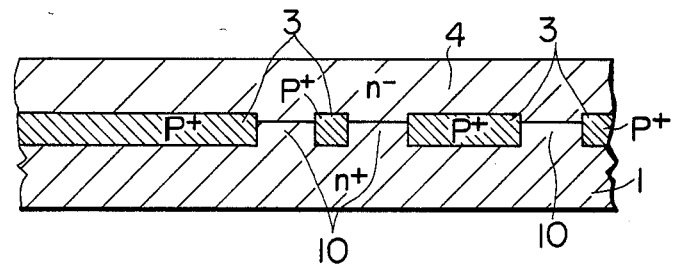
Figure 1D:
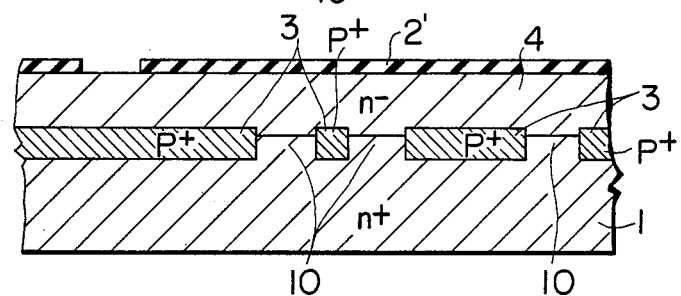
Figure 1E:
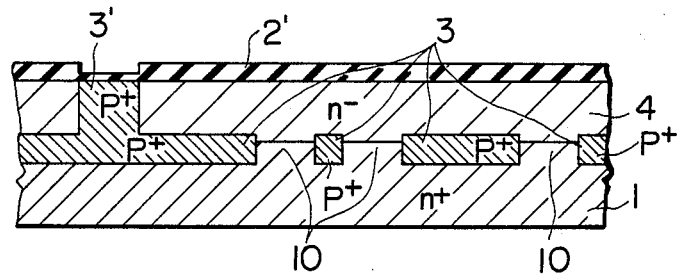
Figure 1F:
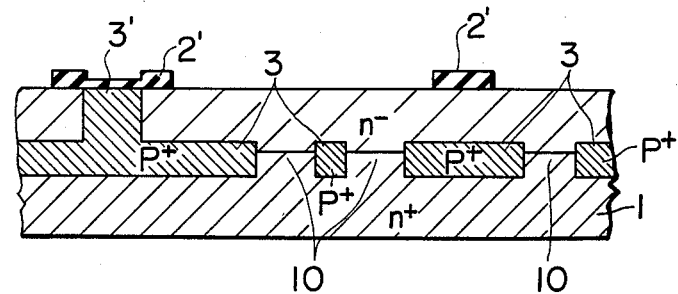
Figure 1G:
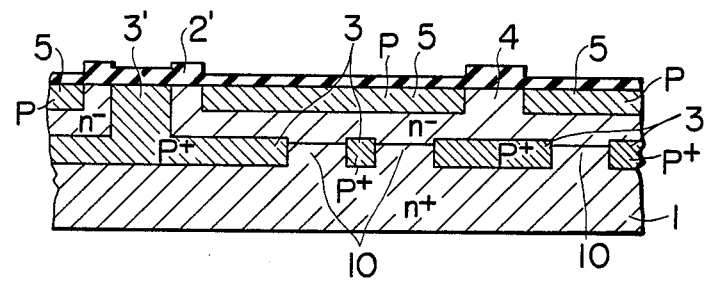
Figure 1H:
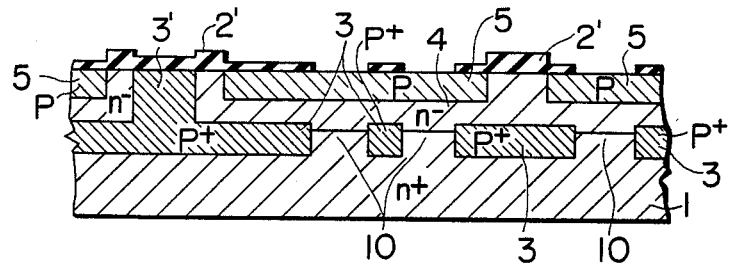
Figure 1I:
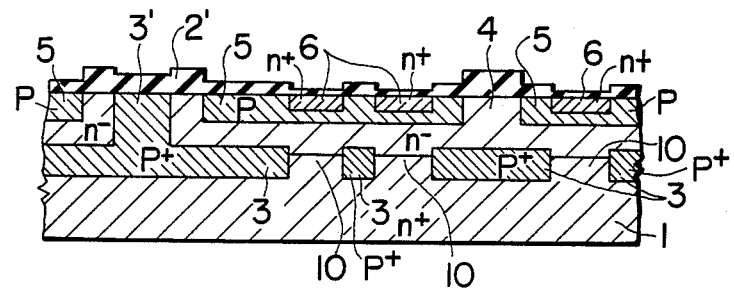
Figure 1J:
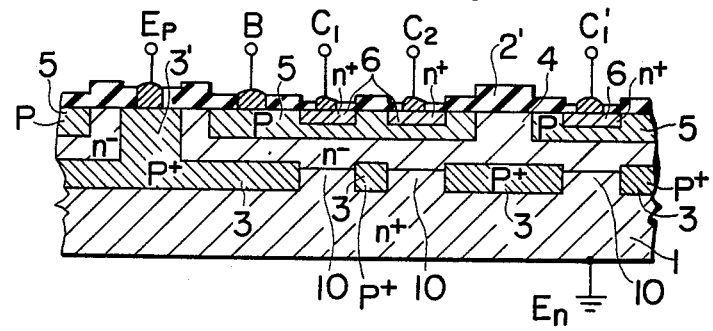

Referring now to FIG. 1a to FIG. 1j, there are shown sectional views illustrating the sequential steps in the process for manufacturing the I²circuit according to the present invention. The particulars of these steps are as follows.

Step (a); A silicon oxide (SiO₂) layer 2 is formed on the surface of the n⁺semiconductor substrate 1 by known techniques, and then part of this SiO₂ layer 2 is selectively removed to expose the portions which are to be positioned immediately beneath the collector region of an NPN transistor which is formed in an ensuing step to act as an inverter.

Step (b): A p⁺region 3 is formed by known diffusion techniques by using the SiO₂ layers 2 as a mask. This p⁺region 3 is utilized as an injector, and all of the portions of said region 3, except for the hole portions 10, are interconnected. Thus, injector 3 is formed as a mesh.

Step (c); The SiO₂ layer 2 is entirely removed, and in its place an n⁻semiconductor layer 4 is formed by a known epitaxial growth method, whereby the injector region 3 is buried in the semiconductor layer.

Step (d); In order to obtain contact with the buried injector region 3, there is formed a p⁺semiconductor region which extends from the substrate surface to the injector region 3. Such a semiconductor region is formed by known diffusion techniques. An SiO₂ layer 2' is formed as a mask for the diffusion.

Step (e); A p+region 3' is formed by diffusion techiques by using the SiO$_2$ layer 2' as a diffusion mask such that the region 3' reaches the injector 3.

Step (f); The SiO$_2$ layer 2' is selectively removed to form a mask for selectively diffusing the base of an NPN transistor acting as an inverter (the base also acting as the collector of a PNP transistor serving both as a constant current source and as a load).

Step (g); Base 5 of the NPN transistor acting as an inverter is formed by diffusion, using the SiO$_2$ layer 2' as a mask.

Step (h); The SiO$_2$ layer 2' is selectively removed to form a mask for diffusing the collector of the transistor acting as an inverter.

Step (i); Collector 6 of the transistor acting as an inverter is formed by diffusion, using said SiO$_2$ layer as a mask.

Step (j); A ground terminal En is provided on the reverse side of the substrate 1 while also providing a power source terminal Ep in the p+region 3' connected to the injector 3, an input terminal B in the base 5 of transistor acting as an inverter, and output terminals C1 and C2 for the respective collectors 6.

Figure 1K:
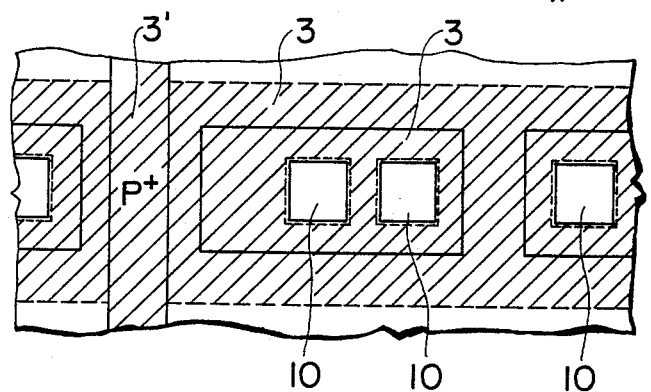

According to the above-described embodiment of the present invention, the NPN transistor acting as an inverter is constituted from a semiconductor structure comprising emitter 1, base 5 and collector 6, while the PNP transistor acting as both a constant current source and a load is constituted from a semiconductor structure comprising emitter 3, base 4 and collector 5. In this construction, the emitter region or injector region 3 of the PNP transistor is entirely buried except for the portions 10 immediately below the collector region 6 of the NPN transistor, as shown by the broken lines in FIG. 1k. Thus, since the emitter (injector) of the PNP transistor acting as a constant current source and a load is provided as a buried layer and this transistor is formed as a vertical structure, it is possible to control the base width of the transistor by adjusting the diffusion depth. This enhances the carrier injection efficiency while elevating the operating speed. Substantial area savings are also ensured as the emitter (injector) is formed inside the assembly.

Further, since the injector is present in a portion other than that immediately beneath the collector of the NPN transistor acting as an inverter, the emitter of the NPN transistor is provided in correspondence with the collector, and hence invalid portions of carriers injected from the emitter are decreased, to allow a reduction in the reactive power.

As is apparent from the foregoing explanation, the I$^2$L circuit according to the present invention is capable of reducing the product of switching speed x power consumption, thus allowing an increased switching speed. Substantial area savings can be also provided.

Figure 2:
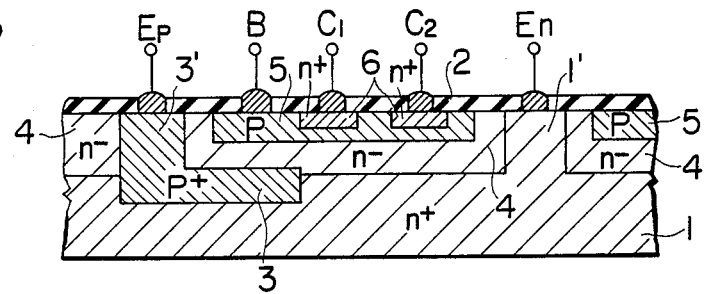
FIG. 2 is a sectional view of a semiconductor integrated circuit according to another embodiment of the present invention.
Figure 3A:
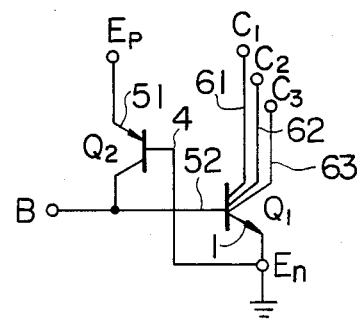
FIG. 3a is a known I²L circuit diagram.
Figure 3B:
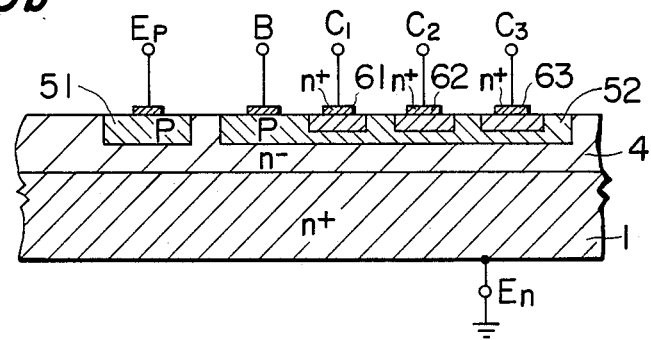
FIG. 3b is a sectional view of an I²L circuit formed by the known techniques.
Figure 4:
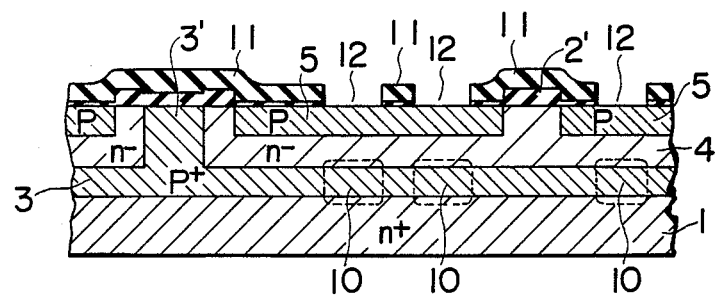
FIG. 4 is a sectional view of a semiconductor integrated circuit in one step of the manufacturing process which was partly modified from the process shown in FIGS. 1a–1k.

The present invention can be embodied in various other ways. For instance, as is shown in FIG. 4, a p-type injector region 3 may be previously formed over the entire surface, and then a photo-resistant layer 11 may be formed over the entire surface thereof except for the portions where the collectors of the NPN transistors are to be formed, by utilizing a glass mask for forming the collectors of the NPN transistors. Then, n-type impurities are introduced into the areas 10 spaced apart from the surface of the semiconductor substrate through openings 12 in the photo-resistant layer 11 by using ion-implantation technology, and thereafter n-type collector regions are formed by diffusion through the same openings 12. In this case, since the mask for forming the injector 3 and that for forming the collector 6 are the same, positional aberrations between the injector 3 and collector 6 can be corrected, allowing a reduction in the reactive power. Also, injector 3 can be provided at any part, provided that it is positioned immediately below the NPN transistors but not immediately below their collectors, as shown in FIG. 2. In this case, although the effect of reducing the reactive power in the NPN transistors is decreased as compared with the previous embodiment, better area savings and switching speed are provided than with the conventional I$^2$L circuits. Also, the common emitter may be arranged such that the electrode is provided from the substrate surface as shown in the same drawing.

What is claimed is:

1. A semiconductor device comprising:
   a semiconductor layer of a first conductivity type;
   a first semiconductor region of a second conductivity type, opposite to said first conductivity type, formed on said semiconductor layer;
   a second semiconductor region of the second conductivity type closely spaced from, and extending beneath part of, said first region so as to constitute a transistor together with said semiconductor layer and said first region;
   a plurality of third semiconductor regions of the first conductivity type each formed on said first region so as to be spaced from each other, and extending over part of said semiconductor layer other than that below which said second region extends, said plurality of third regions constituting a multi-collector transistor together with said semiconductor layer and said first region; and
   said semiconductor layer containing at least one heavily doped region extending beneath said plurality of third regions so that part of said semiconductor layer located beneath said third regions operates as an emitter for said multi-collector transistor.

2. The semiconductor device according to claim 1, in which said first and second conductivity types are N- and P-types, respectively, the transistor constituted by said semiconductor layer and said first and second regions is a PNP transistor, said second region is heavily doped so as to operate as an injector for said PNP transistor.

3. A semiconductor device comprising:
   a semiconductor layer of a first conductivity type;
   a first and a second semiconductor region of a second conductivity type, opposite to said first conductivity type, formed on said semiconductor layer;
   a third semiconductor region of the second conductivity type closely spaced from, and extending beneath part of, said first and second regions so as to constitute a first and a second transistor together with said semiconductor layer and said first and second regions respectively;
   a fourth semiconductor region of the first conductivity type formed on said first region, and extending over part of said semiconductor layer other than that below which said third region extends so as to constitute a third transistor together with said semiconductor layer and said first region;
   a fifth semiconductor region of the first conductivity type formed on said second region, and extending over part of said semiconductor layer other than that below which said third region extends so as to constitute a fourth transistor together with said semiconductor layer and said second region; and said semiconductor layer containing at least one heavily doped region extending beneath said fourth and fifth regions so that part of said semiconductor layer located beneath said fourth and fifth regions operates as emitters for said third and fourth transistors.

4. The semiconductor device according to claim 3, in which said first and second conductivity types are N- and P-types, respectively, said first and second transistors are PNP transistors, said third region is heavily doped so as to operate as injectors for said PNP transistors.

5. A semiconductor device comprising:
a heavily doped first semiconductor region of a first conductivity type;
a second semiconductor region of a second conductivity type, opposite to said first conductivity type, formed on said first semiconductor region, and having a first and a second opening;
a third semiconductor region of the first conductivity type formed on said second semiconductor region and contacting said first semiconductor region through said first and second openings;
a fourth semiconductor region of the second conductivity type formed on said third semiconductor region so as to constitute a first transistor together with said second and third regions, said fourth semiconductor region extending over said first opening;
a fifth semiconductor region of the second conductivity type formed on said third semiconductor region so as to constitute a second transistor together with said second and third regions, said fifth semiconductor region extending over said second opening;
a sixth semiconductor region of the first conductivity type formed on part of said fourth semiconductor region located over said first opening so as to constitute a third transistor together with said third and fourth semiconductor regions as well as part of said first semiconductor region located at said first opening; and
a seventh semiconductor region of the first conductivity type formed on part of said fifth semiconductor region located over said second opening so as to form a fourth transistor together with said third and fifth semiconductor regions as well as part of said first semiconductor region located at said second opening.

6. A semiconductor device comprising:
a heavily doped first semiconductor region of a first conductivity type;
a second semiconductor region of a second conductivity type, opposite to said first conductivity type, formed on said first semiconductor region, and having a first and a second opening;
a third semiconductor region of the first conductivity type formed on said second semiconductor region, and contacting said first semiconductor region through said first and second openings;
a fourth semiconductor region of the second conductivity type formed on said third semiconductor region so as to constitute a transistor together with said second and third regions, said fourth semiconductor region extending over said first and second openings; and a fifth and a sixth semiconductor region of the first conductivity type formed on part of said fourth semiconductor region located over said first and second openings, respectively, so as to work as collectors for a multi-collector transistor constituted together with said third and fourth semiconductor regions as well as part of said first semiconductor region located at said first and second openings.

7. An I²L circuit device comprising:
a first heavily doped semiconductor layer of an N conductivity type;
a second heavily doped semiconductor layer of a P conductivity type, formed on said first layer and having at least one opening;
a third lightly doped semiconductor layer of the N conductivity type formed on said second layer and contacting said first layer through said opening;
at least one first semiconductor region of the P conductivity type formed on said third layer so as to constitute at least one PNP transistor together with said second and third layers, in which said second layer operates as an injector for said PNP transistor; and
a plurality of second semiconductor regions of the N conductivity type formed on part of said first region below which said opening locates so as to form a plurality of NPN transistors, in which part of said first and second layers located at said opening operates as emitters for said NPN transistors and said second regions operates as collectors for said NPN transistors.

8. The I²L device of claim 7, wherein said third layer as well as said first and second regions shares a planar surface of a semiconductor body, and which further comprises a third heavily doped region of the P conductivity type extending from said planar surface and being connected to said second layer.

9. A semiconductor integrated injection logic circuit device comprising:
a semiconductor layer of a first conductivity type;
a first semiconductor region of a second conductivity type, opposite said first conductivity type, acting as the base region of a first transistor, said first semiconductor region being formed in said semiconductor layer and extending to one surface of said layer;
a second semiconductor region of said first conductivity type acting as the collector region of said first transistor, said second semiconductor region being formed in said first semiconductor region and extending to said one surface of said semiconductor layer; and
a third semiconductor region of said second conductivity type acting as the emitter region of a second transistor, said third semiconductor region being formed spaced apart from said first semiconductor region so as to form a second transistor, where said first semiconductor region acts as its collector and said semiconductor layer acts as its base; and
wherein a buried semiconductor layer having said second conductivity type is provided spaced apart from said first semiconductor region at a portion positioned immediately beneath said first semiconductor region, said third semiconductor region extends to said buried layer, a heavily doped fourth semiconductor region of said first conductivity type acting as the emitter region of said first transistor is formed at least a portion positioned immediately beneath said second semiconductor region, said first and second semiconductor regions define therebetween a first P-N junction which is reverse biased, and said third semiconductor region and said buried layer form with said semiconductor layer a second P-N junction which is forward biased.

10. A semiconductor integrated injection logic circuit device comprising:

a semiconductor substrate having a first conductivity type, having first and second principal surfaces, and constituting the base of a lateral transistor and the emitter of a vertical transistor;

a first semiconductor region of a second conductivity type, opposite said first conductivity type, disposed in a first prescribed portion of said first principal surface, extending to a first predetermined depth into said substrate therebeneath, and constituting the collector of said lateral transistor and the base of said vertical transistor;

a second semiconductor region of said first conductivity type, disposed in a selected portion of said first principal surface, extending a preselected depth into said first semiconductor region, defining a first PN junction with said first semiconductor region, and constituting the collector of said vertical transistor; and a third semiconductor region of said second conductivity type disposed in a second prescribed portion of said first principal surface spaced apart from said first prescribed portion by semiconductor material of the substrate therebetween, extending vertically to a second predetermined depth into said substrate beneath said first principal surface and, from said second predetermined depth, extending laterally beneath and spaced apart from a portion of said first semiconductor region, by semiconductor material of said substrate therebetween, except any portion thereof beneath said second semiconductor region, said third semiconductor region defining a second PN junction with said substrate, and constituting the emitter region and an injector region of said lateral transistor; and wherein said first PN junction is reverse-biased, and said second PN junction is forward biased.

11. A semiconductor integrated injection logic circuit device according to claim 10, wherein said first conductivity type is N conductivity type, and said second conductivity type is P conductivity type.

12. A semiconductor integrated injection logic circuit device according to claim 10, wherein the laterally extending portion of said third semiconductor region extends beneath the entirety of said first semiconductor region except any portion thereof beneath said second semiconductor region.

13. A semiconductor integrated injection logic circuit device according to claim 12, wherein said first conductivity type is N conductivity type, and said second conductivity type is P conductivity type.

14. A semiconductor integrated injection logic circuit device according to claim 13, wherein the resistivity of said third semiconductor region is less than the resistivity of said first semiconductor region.

15. A semiconductor integrated circuit device as defined in claim 1, wherein said buried layer is provided in the entire structure positioned immediately beneath said first semiconductor region except for the area positioned immediately beneath said second semiconductor region.

* * * * *